US006956437B2

(12) United States Patent
Lopez et al.

(10) Patent No.: US 6,956,437 B2
(45) Date of Patent: Oct. 18, 2005

(54) METAL-OXIDE-SEMICONDUCTOR DEVICE HAVING INTEGRATED BIAS CIRCUIT

(75) Inventors: Osvaldo Jorge Lopez, Lebanon, NJ (US); Joel Morrison Lott, Quakertown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/744,563

(22) Filed: Dec. 23, 2003

(65) Prior Publication Data

US 2005/0134359 A1    Jun. 23, 2005

(51) Int. Cl.[7] ................................................ H03F 3/04
(52) U.S. Cl. ..................................... 330/296; 330/289
(58) Field of Search ........................ 327/530; 330/288, 330/289, 296, 302

(56) References Cited

U.S. PATENT DOCUMENTS

| | | | | |
|---|---|---|---|---|
| 5,394,026 | A | 2/1995 | Yu et al. ...................... | 327/536 |
| 5,748,030 | A | 5/1998 | Koifman et al. ............ | 327/513 |
| 6,492,874 | B1 * | 12/2002 | Shih ........................... | 330/288 |
| 6,549,076 | B2 * | 4/2003 | Kuriyama ................... | 330/296 |
| 6,774,724 | B2 * | 8/2004 | Krvavac ..................... | 330/296 |
| 2003/0001659 | A1 | 1/2003 | Rosa .......................... | 327/538 |
| 2004/0056721 | A1 * | 3/2004 | LeSage et al. .............. | 330/289 |

FOREIGN PATENT DOCUMENTS

EP    04 25 6760    4/2005

OTHER PUBLICATIONS

R.J. Widlar et al., "Dynamic Safe-Area Protection for Power Transistors Employs Peak-Temperature Limiting," IEEE Journal of Solid-State Circuits, vol. SC-22, No. 1, pp. 77-84, Feb. 1987.

* cited by examiner

*Primary Examiner*—Quan Tra

(57) ABSTRACT

An IC device includes an MOS device having a gate terminal, a source terminal and a drain terminal, the gate terminal being operatively coupled to an input of the IC device, the drain terminal being operatively coupled to an output of the IC device, and the source terminal being coupled to a negative voltage supply. The IC device further includes a bias generator operatively coupled to the gate terminal of the MOS device, the bias generator generating a bias voltage and/or a bias current for biasing the MOS device at a substantially constant quiescent operating point. The bias generator is configured such that the bias voltage and/or bias current varies as a function of a junction temperature of the MOS device. In this manner, the bias generator accurately tracks one or more operating conditions of the MOS device, thereby improving the performance of the device.

15 Claims, 3 Drawing Sheets

METAL-OXIDE-SEMICONDUCTOR DEVICE HAVING INTEGRATED BIAS CIRCUIT

FIELD OF THE INVENTION

The present invention relates generally to semiconductor devices, and more particularly relates to a metal-oxide-semiconductor (MOS) device having a bias circuit integrated therewith.

BACKGROUND OF THE INVENTION

In order for an amplifier (e.g., a class AB amplifier) to operate according to specified design criteria, the quiescent bias current of an MOS device, including a lateral diffused MOS (LDMOS) power transistor, used in the amplifier must remain substantially constant over temperature and/or process variations. Unfortunately, this bias current is largely dependent upon, among other parameters, a threshold voltage of the MOS device, which exhibits a strong temperature dependence. Additionally, since the threshold voltage of the MOS device is significantly affected by variations in semiconductor process parameters, the threshold voltage typically varies widely from device to device.

Conventional amplifiers are known to employ external bias generators having temperature compensation circuits for providing a relatively temperature-independent bias current for biasing a discrete MOS device used in the amplifiers. For example, it is well-known to use a bandgap reference generator, which is essentially an operational amplifier in conjunction with a temperature tracking diode for detecting temperature variations. Other known methodologies for tracking temperature may include the use of software lookup tables. However, since these bias circuits are external to the packaged MOS device, such conventional compensation methodologies, which often rely on sensing an ambient air temperature or a case temperature of the device, are not able to accurately track the temperature and/or process characteristics of the MOS device itself. Moreover, these additional circuits and/or methodologies are often very complex and may require manual bias current adjustments (e.g., in order to compensate for process variations) for each amplifier utilized, therefore making such circuit configurations costly to implement.

There exists a need, therefore, for techniques capable of accurately compensating for variations in a bias condition of an MOS device resulting, at least in part, from temperature and/or process variations of the device, without suffering from one or more of the problems exhibited by conventional circuits and methodologies.

SUMMARY OF THE INVENTION

In accordance with one aspect of the invention, a semiconductor device is couplable to a first transistor for maintaining a substantially constant quiescent operating point in the first transistor. The semiconductor device includes a bias generator operatively coupled to the first transistor and integrated therewith, the bias generator generating a bias output for biasing the first transistor at a substantially constant quiescent operating point. The bias generator is configured such that the bias output varies as a function of a junction temperature of the first transistor.

In accordance with another aspect of the present invention, an integrated circuit (IC) device includes an MOS device having a gate terminal, a source terminal and a drain terminal, the gate terminal being operatively coupled to an input of the IC device, the drain terminal being operatively coupled to an output of the IC device, and the source terminal being coupled to a negative voltage supply. The IC device further includes a bias generator operatively coupled to the gate terminal of the MOS device, the bias generator generating a bias voltage and/or a bias current for biasing the MOS device at a substantially constant quiescent operating point. The bias generator is configured such that the bias voltage and/or bias current varies as a function of a junction temperature of the MOS device. In this manner, the bias generator accurately tracks one or more operating conditions of the MOS device, thereby improving the performance of the device.

The present invention, in an illustrative embodiment, provides techniques for automatically adjusting a quiescent bias current in a packaged discrete transistor device by integrating a bias generator in the same IC package as the discrete transistor device. The bias generator is configured such that a reference current flowing in a reference transistor in the bias generator is a substantially fixed percentage of the quiescent current flowing in the discrete transistor device. The reference transistor is substantially matched to the discrete transistor, at least in terms of semiconductor process characteristics (e.g., threshold voltage), and is preferably located in close relative proximity to the discrete device such that the bias generator more accurately tracks variations in junction temperature and/or process parameters associated with the discrete transistor device.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative discrete power MOS transistor device comprising a bias circuit packaged therewith. It should be appreciated, however, that the present invention is not limited to this or any particular circuit arrangement. Rather, the invention is more generally applicable to improved techniques for providing a quiescent bias voltage and/or current for a transistor device which accurately compensates for variations in at least temperature and/or semiconductor process parameters, which can undesirably affect the operating point of the device. Additionally, because the bias circuit is integrated in the same package as the transistor device, the number of external circuit components required to implement the packaged device in conjunction with, for example, an amplifier circuit, can be advantageously reduced.

Figure 1:
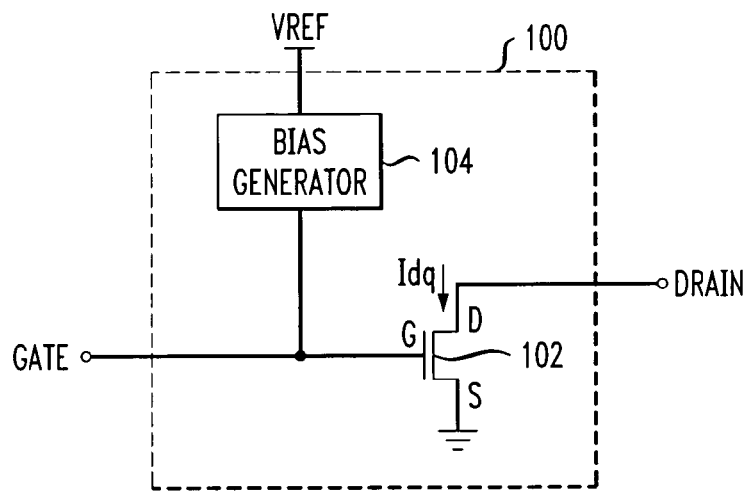
FIG. 1 is a simplified block diagram illustrating an exemplary IC device comprising an MOS transistor packaged with a bias generator, formed in accordance with one embodiment of the present invention.

FIG. 1 depicts a simplified block diagram of an exemplary IC device 100 formed in accordance with one embodiment of the present invention. The exemplary IC device 100 includes an MOS transistor device 102 having a gate (G) terminal, a drain (D) terminal and a source (S) terminal. The MOS transistor 102 is preferably an n-type power MOS (NMOS) transistor suitable for use, for example, in a radio frequency (RF) power amplifier circuit capable of operating at frequencies above about 400 megahertz (MHz), although essentially any transistor device (e.g., p-type MOS transistor, bipolar junction transistor (BJT), etc.) can be used, with or without modifications to the IC device 100, as will be understood by those skilled in the art. Such power amplifier circuits may be employed, for instance, in a multi-carrier and/or single-carrier wireless base station. An input GATE of the IC device 100 is preferably coupled to the gate terminal of the transistor 102 and an output DRAIN of the IC device is coupled to the drain terminal of the transistor. The source terminal of the transistor 102 may be connected to a negative voltage supply, which may be ground or an alternative voltage source.

The exemplary IC device 100 further includes a bias generator 104 coupled to the gate terminal of the transistor 102. The bias generator 104 is preferably configured for automatically biasing the transistor 102 at a substantially constant quiescent operating point. The bias generator 104 may include an input for receiving a reference voltage VREF, a reference current (not shown), or any combination of a reference voltage and a reference current. The reference voltage VREF and/or reference current may be generated internally to the IC device 100, or alternatively the reference voltage and/or current may be generated externally to the IC device as shown.

As previously stated, the quiescent bias current of the transistor device must remain substantially constant over temperature and/or process variations so that an amplifier circuit utilizing such device will not experience a degradation in performance (e.g., linearity, gain, efficiency, etc.). Since the quiescent bias current (Idq) of the transistor device is largely dependent upon, among other parameters, a threshold voltage of the device, which exhibits a strong temperature dependence, biasing the transistor device with a fixed gate voltage is not adequate. Therefore, it is important that the bias generator be able to accurately sense a junction temperature of the transistor device and automatically adjust the bias current Idq accordingly to compensate for such temperature variation. While it may be known to use external bias circuits capable of adjusting the bias voltage in response to variations in temperature, such circuits, by their nature of being external to the packaged IC device, are simply not capable of accurately adjusting the bias voltage to accurately track the junction temperature of the transistor device itself.

The input RF signal level is generally not constant, and therefore the junction temperature of the transistor device may vary significantly over time. In a traditional power amplifier circuit, an external bias generator may be arranged to sense an ambient air temperature surrounding the IC package or the case temperature of the IC package and use this information to adjust the gate voltage supplied to the transistor as the temperature is varied. However, the ambient air temperature or case temperature of the IC package is generally not equivalent to the junction temperature of the transistor device. The case of the IC device typically functions as a heat sink, and thus the case temperature is, at best, only representative of an average of the junction temperature of the transistor device over time. Consequently, the conventional power amplifier circuit arrangement is not capable of accurately adjusting the quiescent bias current of the transistor device to compensate for real time variations in the junction temperature of the transistor. Moreover, as previously stated, conventional power amplifier circuit implementations often require complex external temperature compensation circuitry coupled to the device, which adds significantly to the overall cost of the amplifier design and manufacture.

Figure 2:
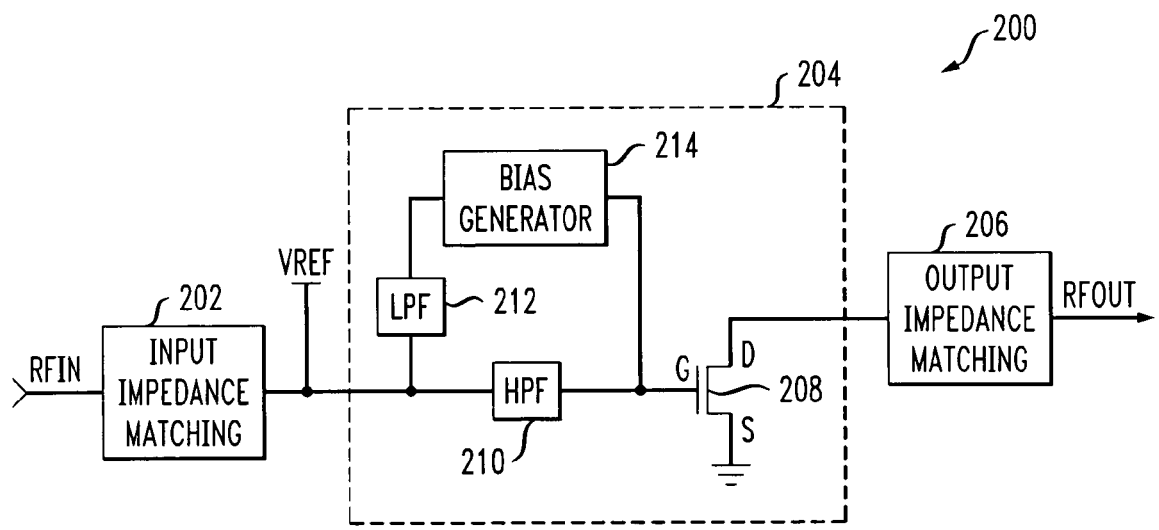
FIG. 2 is a block diagram illustrating an exemplary amplifier circuit in which the techniques of the present invention are implemented.

FIG. 2 depicts a block diagram of an illustrative amplifier circuit 200 in which the techniques of the present invention are employed. The amplifier circuit 200 preferably includes an exemplary IC device 204 having an input coupled to an input impedance matching network 202 and an output coupled to an output impedance matching network 206. The input signal RFIN is preferably presented to an input of the input impedance matching network 202 and an output of the output impedance matching network 206 preferably forms the output RFOUT of the amplifier circuit 200. The exemplary IC device 204, which may be similar to the IC device 100 shown in FIG. 1, includes an MOS transistor device 208 having gate (G), drain (D) and source (S) terminals, and a bias generator 214 operatively coupled to the MOS transistor. The IC device 204 may also include a low-pass filter (LPF) circuit 212 coupled between the input of the IC device and an input of the bias generator 214, and a high-pass filter (HPF) circuit 210 coupled between the input of the IC device and the gate terminal of the MOS transistor 208. The LPF circuit 212 functions, at least in part, to substantially attenuate any frequency components above a desired frequency cutoff that may be present in a reference voltage VREF provided to the IC device 204, thereby passing a substantially direct current (DC) reference signal VREF to the bias generator 214. The HPF circuit 214 functions, at least in part, to substantially remove any frequency components below a desired cutoff present in the input signal RFIN, including any DC components, provided to the MOS transistor 208.

Figure 3:
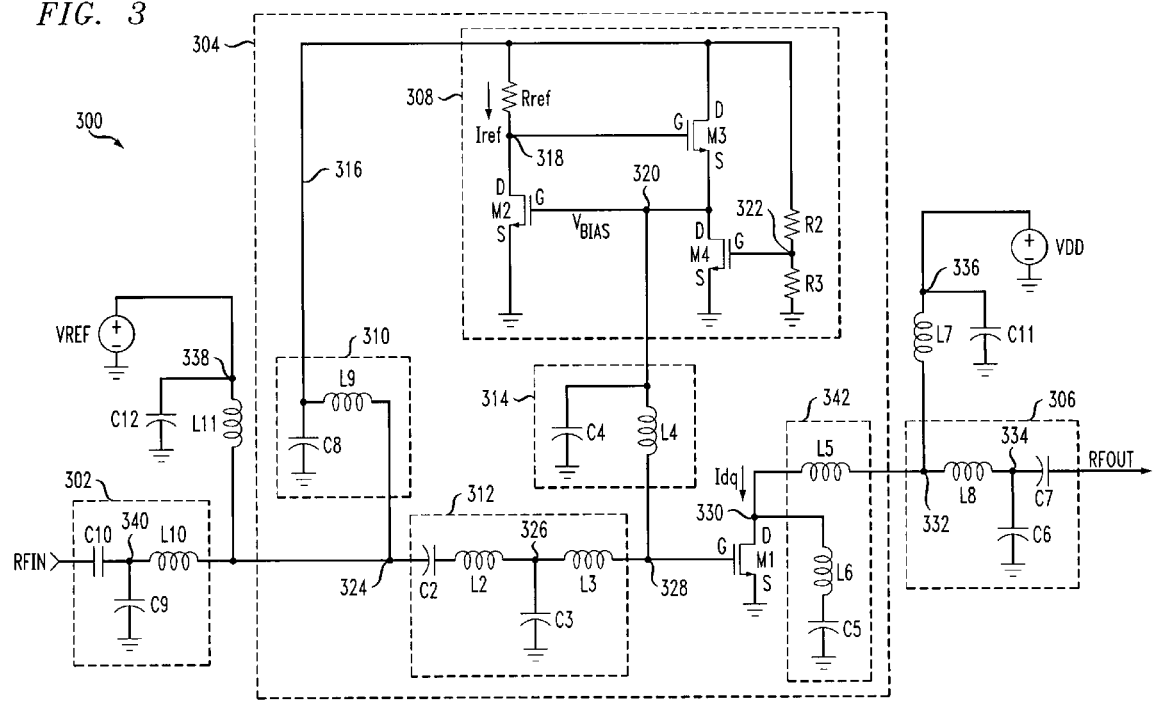
FIG. 3 is a schematic diagram depicting an exemplary amplifier circuit, formed in accordance with an illustrative embodiment of the invention.

FIG. 3 is a schematic diagram depicting an illustrative amplifier circuit 300 in which the techniques of the present invention are implemented. The amplifier circuit 300 includes an exemplary IC device 304 operatively coupled between an input impedance matching network 302 and an output impedance matching network 306. The exemplary IC device 304 includes an NMOS transistor M1 having a source (S) terminal connected to a negative voltage supply, which may be ground, a gate (G) terminal and a drain (D) terminal. Transistor M1 is preferably a power device, such as, but not limited to, an RF LDMOS device. The drain terminal of M1 is preferably coupled to a substantially constant positive voltage supply VDD, or an alternative voltage source. The positive voltage supply is preferably filtered by a LPF circuit, which may comprise an inductor L7 connected at a first end to a positive terminal of voltage supply VDD at node 336 and connected at a second end to the output of the IC device 304 at node 332, and a capacitor C11 connected between node 336 and the negative voltage supply.

The IC device 304 further includes a bias generator 308 which is operatively coupled to the NMOS transistor M1. An important aspect of the invention is that the bias generator 308 is integrated in the same IC package as the NMOS power transistor M1. The bias generator 308 is configured to substantially track variations in a junction temperature of, and/or process parameters associated with, transistor M1. The bias generator 308 in the exemplary IC device 304 may comprise a threshold-referenced source, including a first NMOS transistor M2, a second NMOS transistor M3 and a third NMOS transistor M4, each transistor having gate (G), drain (D) and source (S) terminals. The threshold-referenced source is a simple means of providing a relatively constant output voltage and/or current that is at least substantially independent of variations in supply voltage as well being relatively temperature independent. In order for the bias generator 308 to more accurately track transistor M1, transistors M2, M3 and M4 are preferably substantially matched to, and located in close relative proximity with, transistor M1.

Transistor M2 in bias generator 308 is preferably configured as a gain stage, with its source terminal connected to the negative voltage supply and its drain terminal connected to a reference voltage supply via a series-connected resistor Rref. Resistor Rref is connected at a first end to the drain terminal of transistor M2 at node 318 and is connected at a second end to the reference voltage supply at node 316. Transistor M3 is preferably configured as a source follower forming a negative feedback loop around transistor M2, with the gate terminal of M3 connected to the drain terminal of M2 at node 318, the drain terminal of M3 connected to the reference voltage at node 316, and the source terminal of M3 connected to the gate terminal of M2 at node 320. Transistor M4 preferably functions as a load device for transistor M3 and is configured such that its drain terminal is connected to the source terminal of M3 at node 320, its source terminal is connected to the negative voltage supply, and its gate terminal is connected to a bias voltage at node 322. The bias voltage may established by a simple voltage divider circuit comprising series-connected resistors R2 and R3 connected between the negative voltage supply and the reference voltage supply at node 316. It is to be appreciated that alternative bias circuit configurations are similarly contemplated by the present invention.

The reference voltage presented to the bias generator 308 at node 316 may be used to control an output voltage $V_{BIAS}$ from the bias generator 308 at node 320 as desired. This reference voltage is preferably supplied from a substantially constant reference voltage source VREF. Although shown in the figure as an external voltage source, the reference voltage may alternatively be generated internally to the IC device 304. In order to substantially remove any frequency components above a desired cutoff frequency that may be present in the reference voltage, the reference voltage source VREF may be filtered by one or more LPF networks prior to being connected to the bias generator 308 at node 316.

For instance, reference voltage source VREF may be coupled to the bias generator at node 316 via a first LPF circuit connected between node 338 and an input to the IC device 304 at node 324, and a second LPF circuit 310 connected between node 324 and node 316. The first LPF circuit may be configured as a simple inductance-capacitance (LC) filter comprising a capacitor C12 connected at a first end to the negative voltage supply and connected at a second end to a positive terminal of the reference source VREF at node 338, and an inductor L11 connected in series between node 338 and node 324. Likewise, the second LPF circuit 310 may be configured as a simple LC filter comprising a capacitor C8 connected between node 316 and the negative voltage supply, and an inductor L9 connected in series between node 324 and node 316. It is to be appreciated that one or both LPF circuits may alternatively be configured as a simple resistance-capacitance (RC) circuit by replacing the inductors L11 or L9 with a suitable resistor, as will be understood by those skilled in the art.

The output voltage $V_{BIAS}$ from the bias generator 308 at node 320 is preferably presented to the gate terminal of transistor M1. This output bias voltage may be filtered to substantially attenuate any frequency components above a desired cutoff frequency that may be present in the bias voltage by passing the voltage through a LPF circuit 314. A primary function of LPF circuit 314 is to provide a relatively high impedance in the frequency range of operation (e.g., RF) looking from gate terminal of transistor M1 at node 328 into the bias generator 308 at node 320. In this manner, the gate terminal of M1 will not be significantly loaded by the bias generator 308 at high frequencies.

The LPF circuit 314 may comprise a capacitor C4 connected at a first end to the negative voltage supply and connected at a second end to the output of the bias generator at node 320, and an inductor L4 connected in series between node 320 and the gate terminal of transistor M1 at node 328. As in the case of LPF circuit 310 described above, LPF circuit 314 may alternatively be configured as a simple RC circuit by replacing the inductor L4 with a suitable resistor, as will be understood by those skilled in the art.

The IC device 304 may further comprise one or more impedance matching networks integrated therewith. For example, exemplary IC device 304 preferably comprises an input impedance matching circuit 312 connected in series between the input to the IC device at node 324 and the gate terminal of transistor M1 at node 328. The IC device 304 may further comprise an output impedance matching circuit 342 connected in series between an output of the IC device at node 332 and a drain terminal of transistor M1 at node 330. The input impedance matching circuit 312 preferably includes a capacitor C2 connected at a first end to node 324 and connected at a second end to a first end of an inductor L2. The input impedance matching circuit 312 further includes a second inductor L3 connected in series between at a second end of inductor L2 at node 326 and the gate terminal of M1 at node 328. A capacitor C3 is connected at a first end to the junction of inductors L2 and L3 at node 326 and at a second end to the negative voltage supply. It is to be appreciated that alternative impedance matching circuit arrangements suitable for use with the present invention are similarly contemplated, as will be known by those skilled in the art.

Output impedance matching circuit 342 preferably comprises a first inductor L5 connected at a first end to the drain terminal of transistor M1 at node 330 and connected at a second end to the output of the IC device 304 at node 332. The output impedance matching circuit 342 further includes a second inductor L6 and a capacitor C5 connected in series with one another between the drain terminal of M1 at node 330 and the negative voltage supply. It is to be appreciated that alternative impedance matching circuit arrangements suitable for use with the present invention may be employed.

As previously stated, the amplifier circuit 300 may comprise an input impedance matching network 302 and an output impedance matching network 306. The input impedance matching network may comprise a first capacitor C10 connected at a first end to an input RFIN of the amplifier circuit 300 and connected at a second end to a first end of an inductor L11 at node 340. Inductor L10 is preferably connected at a second end to the input of IC device 304 at node 324. The input impedance matching network 302 further includes a second capacitor C9 connected between node 340 and the negative voltage supply. The output impedance matching network 306 may be configured in substantially the same manner as input impedance matching network 302. Output impedance matching network 306 may comprise a first capacitor C7 connected at a first end to an output RFOUT of the amplifier circuit 300 and connected at a second end to a first end of an inductor L8 at node 334. Inductor L8 is preferably connected at a second end to the output of IC device 304 at node 332. The output impedance matching network 306 further includes a second capacitor C6 connected between node 334 and the negative voltage supply. In a preferred embodiment of the invention, the input and output impedance matching networks 302 and 306, respectively, will match the circuit to about 50 ohms at the input RFIN and output RFOUT at a frequency of about 2.14 gigahertz.

One or more of the inductors utilized in the IC device 304 may comprise integrated inductors (e.g., spiral inductors, etc.). Alternatively, one or more of the inductors may comprise bond wire inductors, etc., as will be understood by those skilled in the art. One or more of the capacitors used in the IC device 304 may include, but are not limited to, MOS capacitors, metal-oxide-metal (MOM) capacitors, junction capacitors, etc.

Table 1 below provides illustrative component values which may be used in the exemplary amplifier circuit 300 shown in FIG. 3. It is to be appreciated that the invention contemplates that alternative component values and/or circuit configurations may also be used.

TABLE 1

| Reference Designation | Value | Reference Designation | Value |
| --- | --- | --- | --- |
| Rref | 17.5 Kilo (K) Ohms | C2 | 10 picofarad (pF) |
| R2 | 6.3 K Ohms | C3 | 23 pF |
| R3 | 1 K Ohms | C4 | 10 pF |
| L2 | 0.1 nanohenry (nH) | C5 | 230 pF |
| L3 | 0.15 nH | C6 | 3.9 pF |
| L4 | 5 nH | C7 | 20 pF |
| L5 | 0.275 nH | C8 | 10 pF |
| L6 | 0.28 nH | C9 | 5.5 pF |
| L7 | 100 nH | C10 | 20 pF |
| L8 | 0.9 nH | C11 | 20 pF |
| L9 | 10 nH | C12 | 10 pF |
| L10 | 0.2 nH | M2 | LDMOS Transistor (289 micron gate) |
| L11 | 10 nH | M3–M4 | LDMOS Transistor (1.8 mm gate) |
| M1 | LDMOS Power Transistor (83 mm gate) | | |

By way of example only, a more detailed explanation of the operation of exemplary IC device 304 will be provided herein, with continued reference to FIG. 3. The reference voltage VREF is preferably applied to the input of the IC device 304 at node 324 through inductor L11. This reference signal is essentially mixed with the RF signal to be amplified, which is applied to the input RFIN of the amplifier circuit 300. The MOS power transistor M1 amplifies the RF signal and generates an amplified RF signal, which is provided at the output RFOUT of the amplifier circuit 300. The LPF circuit 310, which comprises inductor L9 and capacitor C8, substantially extracts only the DC component of the signal presented to the input of the IC device 304 at node 324. This DC reference signal, which is substantially equivalent to VREF, is then fed to the bias generator 308 comprising resistors Rref, R2 and R3, and NMOS transistors M2, M3 and M4. The bias generator 308 generates a gate bias voltage $V_{BIAS}$ that is applied to the gate of the power NMOS transistor M1 through the LPF circuit 314, which functions as a bias decoupling network.

Since, at least at DC, the gate-source voltage of transistors M1 and M2 will be substantially the same, the current Iref flowing through resistor Rref, and thus into transistor M2, will be a ratio of the current Idq flowing into transistor M1. The bias generator reference current Iref is set by resistor Rref, which will have a substantially constant voltage across it that is approximately equal to Vref$-(V_{T2}+V_{T3})$, where $V_{T2}$ is a threshold voltage of transistor M2 and $V_{T3}$ is a threshold voltage of transistor M3. Assuming transistors M2 and M3 are substantially the same size, the voltage across resistor Rref will be approximately Vref$-2V_T$, where $V_T$ is the threshold voltage of either transistor M2 or M3. The current Iref biases the reference transistor M2 with an appropriate current per unit gate width that is to be mirrored in the power transistor M1.

A negative feedback loop is setup around the reference transistor M2 with source follower transistor M3 which operatively adjusts the gate bias voltage of transistor M2. Transistor M4 functions as a constant current load for the source follower transistor M3. The transistors M2, M3, M4 in the bias generator 308 may be significantly smaller in width compared to the power transistor M1. In a preferred embodiment of the invention, transistor M2 has a gate width in the hundreds of microns range (e.g., about 289 microns) and transistor M1 has a gate width in the tens or hundreds of millimeters range (e.g., about 83 millimeters), thus providing a current mirror ratio between transistors M1 and M2 of about 300 to 1. Transistors M3 and M4 are preferably sized with gate widths of about 1.8 millimeters. The quiescent bias current set in the power transistor M1 is approximately (W1/W2)×Iref, where W1 is the gate width of transistor M1 and W2 is the gate width of transistor M2, assuming the gate lengths of the two transistors M1, M2 are the same.

Assuming that the voltage across resistor Rref is substantially constant over variations in temperature, the reference current Iref will also be substantially constant over temperature. Consequently, as a result of the feedback configuration of transistors M2 and M3 in the bias generator 308, the bias generator will operatively adjust the gate voltage $V_{BIAS}$ at node 320 as necessary to maintain a substantially constant reference current Iref over temperature variations. The mirrored current Idq in the power transistor M1 will likewise advantageously remain substantially constant over temperature variations.

The accuracy of the temperature tracking between the bias generator 308 and the power transistor M1 will depend, at least in part, on the matching between transistors M2, M3, M4 in the bias generator 308 and the power transistor M1. It is therefore desirable that transistors M1, M2, M3 and M4 all have similar characteristics. While it is not a requirement that the bias generator 308 be fabricated on the same semiconductor die as the power transistor M1, temperature tracking between the bias generator 308 and transistor M1 will be beneficially improved if the bias generator 308 and power transistor M1 are fabricated together on the same die. Moreover, it is preferred that transistors M2, M3 and M4 being located in close relative proximity to transistor M1, whether or not they are all formed on the same die, so that variations in the junction temperature of transistor M1 will closely match variations in the corresponding junction temperatures of transistors M2, M3 and M4.

Assuming that the reference voltage Vref applied to the bias generator 308 is chosen to be somewhat larger than twice the threshold voltage of the transistors M2, M3, M4 in the bias generator, the reference current Iref will remain substantially constant despite variations in the threshold voltage over temperature. The bias generator 308 is preferably also configured to be tolerant of variations in the threshold voltage due to process variations. Thus, the bias generator 308 will advantageously adjust the gate bias voltage of transistor M1 to compensate for process variations in the IC device 304. In this manner, the quiescent operating point of the power transistor M1 will be substantially constant from one IC device to another.

Figure 4:
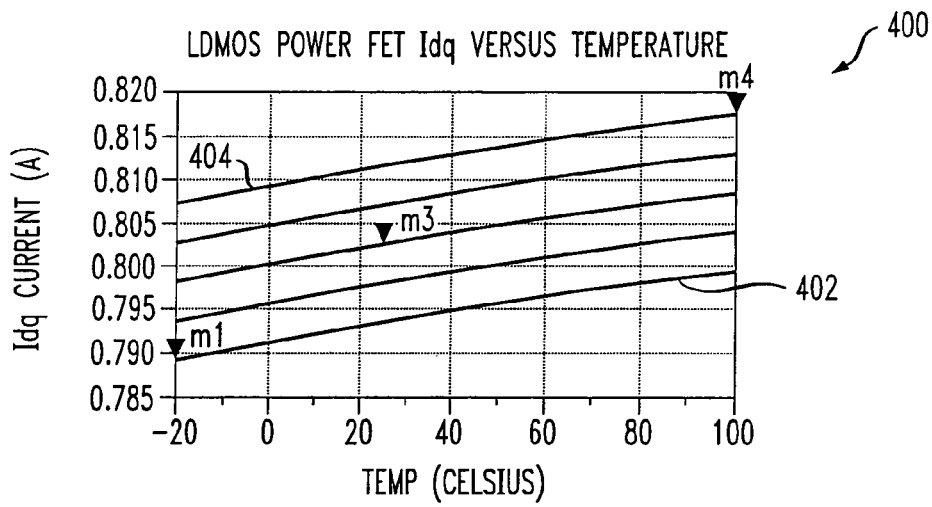
FIG. 4 is a graphical representation depicting simulation results of quiescent drain current in the power transistor M1 shown in FIG. 3 over a specified temperature range, in accordance with the present invention.

FIG. 4 is a graphical representation of illustrative simulation results 400 corresponding to the exemplary IC device 304 shown in FIG. 3. The simulation results 400 depict the quiescent current Idq in the power transistor M1 verses junction temperature of the transistor for several variations in the threshold voltage (vt) of transistor M1. For example, curve 402 indicates a simulated current variation in transistor M1 in a range from about 789 milliamperes (mA) to about 799 mA over a temperature range of −20 degrees Celsius to 100 degrees Celsius, respectively, for a threshold voltage difference of about 0.2 volts below a nominal threshold voltage. Likewise, curve 404 indicates a simulated current variation in transistor M1 in a range from about 807.5 mA to about 817 mA over a temperature range of −20 degrees Celsius to 100 degrees Celsius, respectively, for a threshold voltage difference of about 0.2 volts above a nominal threshold voltage. Overall, as the threshold voltage varies in a range from about 0.2 volts below nominal to about 0.2 volts above nominal, the quiescent current Idq in transistor M1 varies from about 789 mA to about 817 mA, or a difference of about 3.5 percent, over a temperature range from −20 to 100 degrees Celsius.

Figure 5:
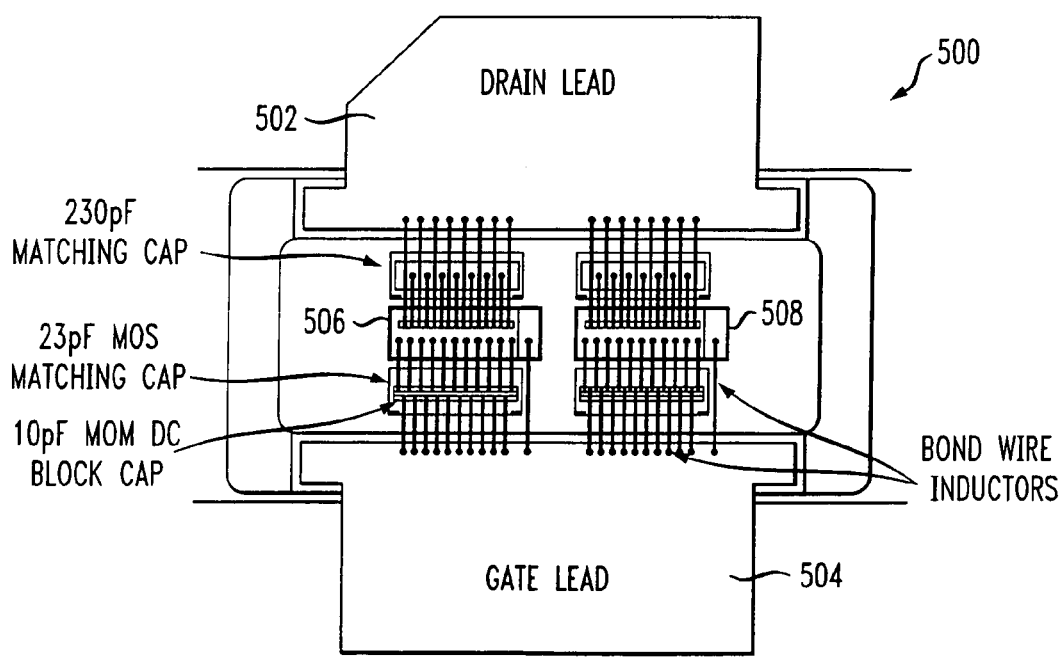
FIG. 5 is a top plan view depicting an exemplary IC package including an MOS device integrated with a bias generator, formed in accordance with an illustrative embodiment of the invention.

As previously explained, while the bias generator 308 is integrated with the power transistor M1 in the same IC package, the two components need not be fabricated on the same semiconductor die to be able to provide a beneficial improvement in performance over conventional amplifier circuit arrangements employing an external bias source. By way of example only, FIG. 5 depicts a top plan view of an illustrative IC package 500 comprising a discrete power MOS transistor device 506 and a bias generator 508 coupled to the transistor. The packaged IC device is shown as a three-terminal device, including a drain lead 502 and a gate lead 504, with the source terminal of the power transistor 506 being available from the bottom of the IC package (not shown).

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A packaged power transistor integrated circuit (IC) device, comprising:
   a metal-oxide-semiconductor (MOS) transistor device including a gate terminal, a source terminal and a drain terminal, the gate terminal being operatively coupled to a first package lead of the IC device, the drain terminal being operatively coupled to a second package lead of the IC device, and the source terminal being adapted for connection to a negative voltage supply; and
   a bias generator operatively coupled to the gate terminal of the MOS device, the bias generator generating a bias output for biasing the MOS device at a substantially constant quiescent operating point, the bias generator being configured such that the bias output varies as a function of a junction temperature of the MOS device;
   wherein the IC device is configured to receive both an input radio frequency (RF) signal and a substantially direct current (DC) reference source signal on the first package lead, the bias generator being adapted to receive the reference source signal and to generate the bias output as a function thereof.

2. The IC device of claim 1, wherein the bias generator comprises a current mirror operatively coupled to the MOS transistor device, the current mirror generating a reference current that is substantially matched to a percentage of a quiescent current in the MOS transistor device, the bias generator being configured to adjust the bias output such that the reference current is substantially constant over variations in one or more operating conditions of the MOS transistor device.

3. The IC device of claim 1, wherein the bias generator comprises a reference transistor operatively coupled to the MOS transistor device, the reference transistor and the MOS transistor device being configured in a current mirror arrangement, wherein a ratio of a reference current in the reference transistor and a quiescent current in the MOS transistor device is substantially constant.

4. The IC device of claim 3, wherein the bias generator further comprises a current source operatively coupled to the reference transistor, the current source being configured to generate the reference current, the bias generator being operative to vary the bias output so as to maintain a substantially constant reference current.

5. The IC device of claim 1, wherein the bias generator comprises:
   a second transistor including gate, source and drain terminals, the gate and source terminals of the second transistor being connected to the gate and source terminals, respectively, of the MOS transistor device, and the drain terminal of the second transistor being connected to a substantially constant current source; and
   a third transistor including gate, source and drain terminals, the gate terminal of the third transistor being connected to the drain terminal of the second transistor, the source terminal of the third transistor being connected to the gate terminal of the second transistor, and the drain terminal of the third transistor being connected to a positive voltage supply, the third transistor being configured to supply the bias output at the gate terminals of the second transistor and MOS transistor device and adjusting the bias output accordingly so as to maintain a substantially constant quiescent current in the MOS transistor device over variations in one or more operating conditions of the MOS transistor device.

6. The IC device of claim 1, further comprising at least one of:
   an input impedance matching circuit operatively coupled between the first package lead of the IC device and the gate terminal of the MOS transistor device; and
   an output impedance matching circuit operatively coupled between the drain terminal of the MOS transistor device and the second package lead of the IC device.

7. The IC device of claim 1, further comprising a filter circuit coupled between the bias generator and the gate terminal of the MOS transistor device, the filter circuit being configurable for substantially removing frequency components above a desired cutoff frequency potentially present in the bias output generated by the bias generator.

8. The IC device of claim 1, wherein the bias generator includes an input for receiving at least one of a reference voltage and reference current, the bias generator controlling a quiescent current in the MOS transistor device in response to the at least one of the reference voltage and reference current.

9. The IC device of claim 8, wherein the at least one of the reference voltage and reference current is generated externally in relation to the IC device.

10. The IC device of claim 8, wherein the at least one of the reference voltage and reference current is generated internally in relation to the IC device.

11. The IC device of claim 1, wherein the MOS transistor device is formed on a same semiconductor die as the bias generator.

12. The IC device of claim 1, wherein the bias generator is formed in close relative proximity to the MOS transistor device.

13. The IC device of claim 1, wherein the MOS transistor device is a lateral drain MOS device.

14. The IC device of claim 1, wherein the bias output comprises at least one of a bias voltage and a bias current.

15. A method for forming a discrete transistor device having a substantially constant quiescent operating point, the method comprising the steps of:

detecting a junction temperature of the transistor device;

generating a bias output for biasing the transistor device at a quiescent operating point, the bias output being a function of a substantially direct current (DC) reference signal supplied to the transistor device; and varying the bias output as a function of the detected junction temperature of the transistor device so as to maintain a substantially constant quiescent operating point in the transistor device over variations in one or more operating conditions of the transistor device;

wherein the DC reference signal and an input radio frequency (RF) signal received by the transistor device are supplied on a same package lead of the transistor device.

* * * * *